United States Patent [19]
Brokaw

[11] Patent Number: 5,347,224
[45] Date of Patent: * Sep. 13, 1994

[54] CURRENT MONITORING CIRCUIT HAVING CONTROLLED SENSITIVITY TO TEMPERATURE AND SUPPLY VOLTAGE

[75] Inventor: A. Paul Brokaw, Burlington, Mass.

[73] Assignee: Analog Devices, Inc., Norwood, Mass.

[*] Notice: The portion of the term of this patent subsequent to Mar. 10, 2009 has been disclaimed.

[21] Appl. No.: 843,349

[22] Filed: Feb. 26, 1992

[51] Int. Cl.$^5$ .......................................... G01R 31/02
[52] U.S. Cl. .................................... 324/522; 324/503; 324/537; 324/126; 340/458; 307/362
[58] Field of Search ............... 324/133, 414, 500, 503, 324/522, 537, 550, 555, 556, 126, 105; 340/661, 458, 641; 307/350, 362, 191, 310

[56] References Cited

U.S. PATENT DOCUMENTS

| | | | |
|---|---|---|---|
| 3,344,343 | 9/1967 | John | 324/428 |
| 3,401,337 | 9/1968 | Beusman et al. | 324/428 X |
| 3,585,482 | 6/1971 | Zelina | 320/39 |
| 3,727,074 | 4/1973 | Keller et al. | 324/428 X |
| 3,887,863 | 6/1975 | Brokaw | 323/19 |
| 3,895,283 | 7/1975 | Peterson | 320/35 |
| 3,971,980 | 7/1976 | Jungfer et al. | 324/428 |
| 4,013,947 | 3/1977 | Arai | 324/503 |
| 4,065,712 | 12/1977 | Godard et al. | 320/39 |
| 4,173,750 | 11/1979 | Riba | 340/80 |
| 4,209,736 | 6/1980 | Reidenbach | 320/22 |
| 4,220,908 | 9/1980 | Nicol | 322/33 |
| 4,278,971 | 7/1981 | Yasui et al. | 340/657 |
| 4,291,302 | 9/1981 | King et al. | 340/458 |
| 4,308,492 | 12/1981 | Mori et al. | 320/32 |
| 4,354,155 | 10/1982 | Speidel et al. | 324/503 X |
| 4,380,725 | 4/1983 | Sherman | 320/35 |
| 4,386,308 | 5/1983 | Emile, Jr. et al. | 320/22 |
| 4,417,183 | 11/1983 | Popard et al. | 315/291 |
| 4,550,303 | 10/1985 | Steele | 340/458 |
| 4,554,500 | 11/1985 | Sokira | 320/31 |
| 4,563,631 | 1/1986 | Mashino et al. | 322/33 |
| 4,574,276 | 3/1986 | Sato | 340/661 |
| 4,575,711 | 3/1986 | Suzuki et al. | 340/511 |
| 4,580,099 | 4/1986 | Zetti | 324/414 |
| 4,667,143 | 5/1987 | Cooper et al. | 320/22 |
| 4,713,607 | 12/1987 | Pepper | 324/133 |
| 4,884,033 | 11/1989 | McConchie, Sr. | 324/503 |
| 4,994,792 | 2/1991 | Ziegler, Jr. | 340/584 |
| 5,047,751 | 9/1991 | Miura et al. | 340/661 |
| 5,057,814 | 10/1991 | Onan et al. | 340/458 |
| 5,095,274 | 3/1992 | Brokaw | 324/537 X |

FOREIGN PATENT DOCUMENTS

| | | |
|---|---|---|
| 0011454 | 5/1980 | European Pat. Off. |
| 2140287 | 1/1973 | France |
| 2562733 | 10/1985 | France |
| 2572860 | 5/1986 | France |
| 2601527 | 1/1988 | France |
| 2137036 | 9/1984 | United Kingdom |
| 0189885 | 8/1986 | United Kingdom |

OTHER PUBLICATIONS

M. Meakin: "Vielseitiger Komparator für Automobilanwendungen" May 27, 1988, Elektronik, vol. 37, No. 11, pp. 111–113.

LM1946 Over/Under Current Limit Diagnostic Circuit, National Semiconductor Data Sheet (pp. 5-16-3-5-173) dated 8707.

Primary Examiner—Gerard R. Strecker
Assistant Examiner—Diep Do
Attorney, Agent, or Firm—Wolf, Greenfield & Sacks

[57] ABSTRACT

An integrated circuit including a comparator having two output states and being responsive to a voltage developed across a shunt in the circuit so that the comparator assumes one of its two output states when the voltage developed across the shunt is greater than a threshold switching voltage and the other of its two output states when the voltage developed across the shunt is less than the threshold switching voltage. The integrated circuit additionally includes a threshold switching voltage sensitivity control circuit, coupled to and controlling the comparator, for controlling a sensitivity of the threshold switching voltage to changes in a supply voltage of the lamp circuit and for controlling a sensitivity of the threshold switching voltage to changes in temperature of the integrated circuit.

17 Claims, 7 Drawing Sheets

CURRENT MONITORING CIRCUIT HAVING CONTROLLED SENSITIVITY TO TEMPERATURE AND SUPPLY VOLTAGE

BACKGROUND OF THE INVENTION

1. Field of the Invention

The present invention relates generally to circuits for monitoring current. More particularly, the present invention relates to a monolithic integrated circuit that can be used to detect faulty lamps in automobile electrical systems.

2. Discussion of the Related Art

In electrical systems, it is often desirable to monitor the current consumed by various loads to determine whether a particular load is functioning properly.

In automobile lighting systems in particular, it is often desirable to monitor the condition of various electrical loads within the automobile such as motors, external vehicle lamps such as signal and warning lamps, and defoggers to determine whether or not a particular load is functional. It is also desirable to be able to test the fuses which supply various circuits in the automobile to determine whether or not the fuses are functioning properly. Within this disclosure, monitoring current through lamps is discussed merely as an illustrative example of the broader concept of monitoring current through electrical loads. The purpose of monitoring the condition of the various electrical loads such as signal and warning lamps in the automobile is to alert the driver to a failure of any one of these loads. Obviously, the failure of a warning or a signal lamp in the automobile poses a safety hazard.

Current monitoring in an automobile lighting circuit is generally accomplished by inserting a current shunt in the lamp circuit. The current shunt is generally a two-terminal resistive element, having one end connected to the automobile power supply source, which is usually the battery, alternator, and voltage regulator, and the other end connected to the load on the circuit, which is usually one or more incandescent lamps or other electrical load. Since the full circuit current passes through the resistive shunt, the resistance of the shunt should be as low as reasonably practicable to avoid unnecessary power consumption as well as excessive heating of the shunt and wiring. The current shunts can be discrete units constructed of special materials, or can be portions of the wiring which supplies power to the lamp being monitored, such as printed circuit board traces or wires in the automobile wiring harness.

Since, as stated, the resistance of the shunt is generally very low, the voltage drop across the shunt which occurs when a particular automobile lamp is activated is correspondingly small. For example, if the battery voltage is 12.000 volts at the input to the shunt, the voltage at the terminal of the shunt connected to the lamp may be on the order of 11.997 volts; the resulting voltage drop across the shunt being approximately 3 mv. Thus, the current monitoring circuit must be able to detect a very small threshold switching voltage which is offset by the much larger power supply voltage.

An integrated circuit capable of using a printed circuit trace as the current shunt and detecting threshold switching voltages on the order of a few millivolts can be seen in my copending patent application Ser. No. 07/410,988, U.S. Pat. No. 5,095,274 entitled Temperature Compensated Apparatus for Monitoring Current Having Controlled Sensitivity to Supply Voltage.

Although that circuit works adequately and is able to use a copper printed circuit board trace as the current shunt in a lamp monitoring circuit, the circuit does have limitations. First, the circuit is designed to track changes in the resistance of a current shunt due to changes in temperature of the shunt where the shunt is a copper printed circuit board trace.

Second, the circuit has a fixed controlled sensitivity to changes in the circuit supply voltage. It is known that the current in an incandescent lamp typically varies at approximately one half the rate of variation of the voltage applied to the lamp. For example, if the voltage applied to the lamp doubles, the lamp current does not double, but rather increases by 50%. Thus, the circuit has to be able to track this variation in lamp current as the circuit supply voltage varies in order to adjust a threshold switching voltage to track this change in lamp current. However, the circuit of application Ser. No. 07/410,988, U.S. Pat. No. 5,095,274 is limited to a 50% sensitivity to changes in circuit supply voltage. If a different lamp were used having a different relationship between applied voltage and current consumption or if a different characteristic sensitivity to changes in supply voltage is desired or required, the previous circuit may not be easily adapted to compensate for this change.

SUMMARY OF THE INVENTION

The present invention overcomes the disadvantages of the prior art by providing an apparatus for monitoring current through a circuit that includes a comparator having two output states and being responsive to a voltage developed across a shunt in the circuit so that the comparator assumes one of its two output states when the voltage developed across the shunt is greater than a threshold switching voltage and the other of its two output states when the voltage developed across the shunt is less than the threshold switching voltage. The apparatus additionally includes a threshold switching voltage sensitivity control circuit coupled to and controlling the comparator for controlling a sensitivity of the threshold switching voltage to changes in a supply voltage of the circuit and for controlling a sensitivity of the threshold switching voltage to changes in temperature. The threshold switching voltage sensitivity control circuit allows the sensitivity of the threshold switching voltage to track changes in resistance of the shunt due to changes in temperature. Through appropriate selection of component values, the threshold switching voltage sensitivity control circuit can provide a positive temperature coefficient, a negative temperature coefficient, or a temperature invariant sensitivity of the threshold switching voltage to changes in temperature and any selected sensitivity to changes in the supply voltage of the circuit. The apparatus also provides for multiple test voltage input circuits which can be compared to a single reference voltage input circuit. The apparatus allows additional test voltage input circuits to be added to the comparator. A current limiting output driver circuit is also provided for supplying to a fault indicator an output current representative of a fault in the circuit. The output driver circuit is capable of supplying the necessary voltage and current to drive a fault indicator such as an incandescent lamp.

The apparatus also provides a timer circuit, coupled between the comparator and the output driver circuit, for delaying activation of the output driver circuit for a selectable, predetermined time interval in response to one of the output states of the comparator. The apparatus also provides a latching circuit, coupled to the timer circuit for storing the output state of the comparator upon activation of the output driver circuit. The apparatus also provides a preview circuit coupled to the comparator circuit for bypassing the timer circuit and the output driver circuit to supply a signal representative of a fault in the circuit being monitored. The apparatus also has reduced capacitance at the input since only three active devices are connected, in a preferred embodiment, to the current shunt. In a preferred embodiment, only two base-emitter junctions of two transistors are connected to the shunt (and in turn the circuit supply voltage). The apparatus may be embodied in a monolithic integrated circuit which is reliable, inexpensive, and easy to manufacture.

The present invention will be more readily understood and apparent from the following detailed description of the invention, which should be read in conjunction with the accompanying drawings, and from the claims which are appended at the end of the detailed description.

BRIEF DESCRIPTION OF THE DRAWINGS

In the drawings, which are incorporated herein by reference and in which like elements have been given like reference characters.

DETAILED DESCRIPTION

For purposes of illustration only, and not to limit generality, the present invention will now be explained with reference to its use in the electrical system of an automobile. However, one skilled in the art will appreciate that the features and functions of the invention are useful in applications outside automobile electrical systems. Furthermore, although specific operating currents and voltages will be discussed, the present invention is able to operate at other voltages and currents, depending upon the particular application. Although current monitoring through lamps is discussed in detail, one skilled in the art will appreciate that the present invention can monitor current through other types of electrical loads as well.

Figure 1:
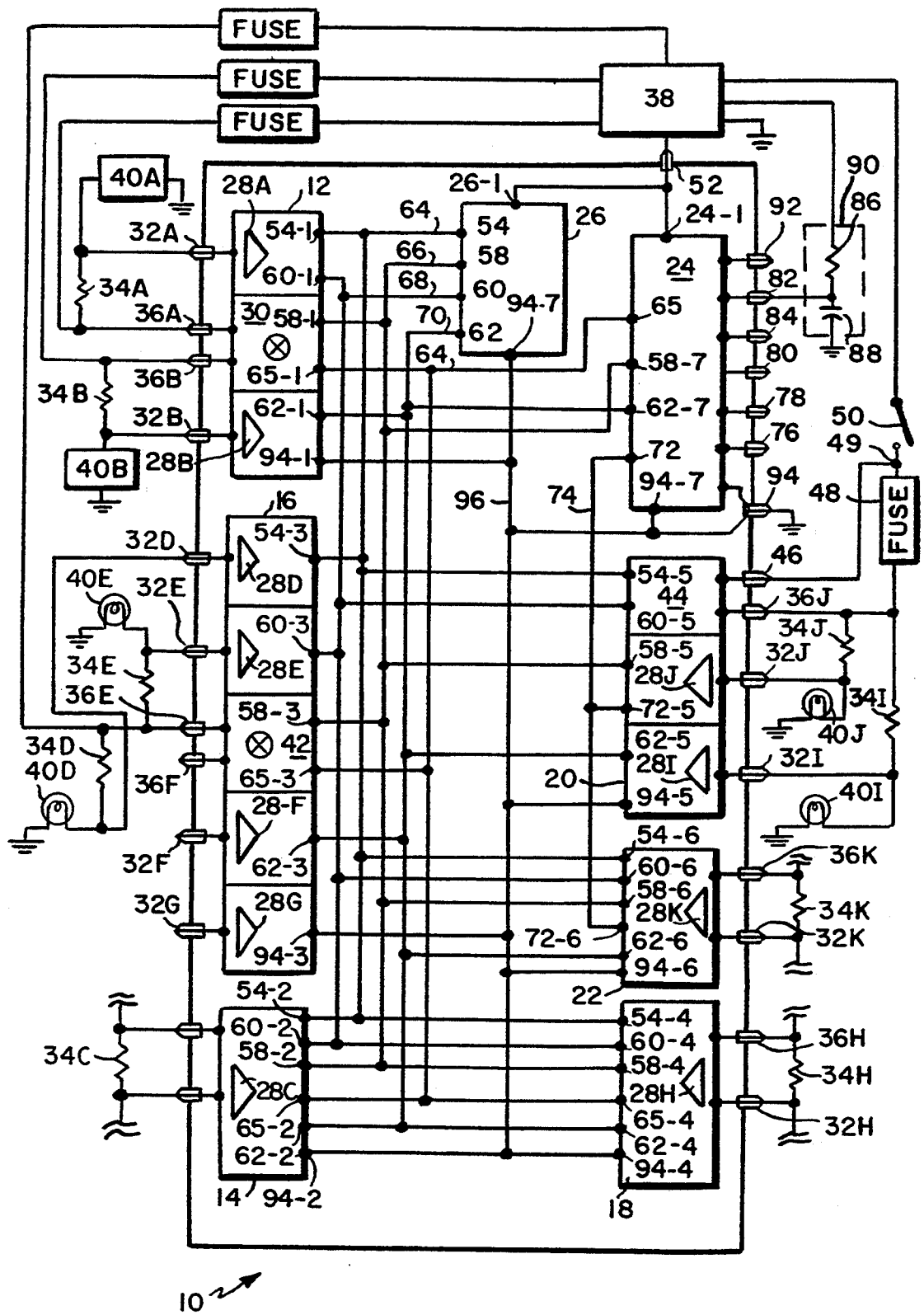
FIG. 1 is an overall functional block diagram of the current monitoring apparatus of the present invention.

Reference is now made to FIG. 1, which illustrates one embodiment of a monolithic integrated circuit 10 of the present invention. The integrated circuit includes modules 12, 14, 16, 18, 20, 22, 24, and 26. Modules 12, 14, 16, 18, 20, and 22 each include at least one comparator module 28. Within this disclosure, letters following a reference character represent an instantiation of a more general element. Comparators 28A–28K compare a voltage at a test input terminal with a voltage at a reference input terminal to determine whether a voltage difference between the test input terminal and the reference input terminal is above or below a threshold switching voltage. If the difference between the voltage at the test input terminal and the voltage at the reference input terminal is less than or equal to the threshold switching voltage, this indicates that insufficient current is being drawn through the shunt by a load such as a lamp. On the other hand, if the difference between the voltage at the test input terminal and the voltage at the reference input terminal is greater than the threshold switching voltage, this indicates that current is being drawn through the shunt by a properly functioning load.

In integrated circuit 10, different configurations of the basic comparator module 28 are used to perform various monitoring functions. Module 12 includes two comparator modules 28A, 28B functionally interconnected by an exclusive-OR function module 30 which provides an implicit fuse test function. Module 12 detects fuse failures and lamp failures in simultaneously switched lamp circuits. A test input terminal 32A of comparator 28A is coupled to the load side of a current shunt 34A. A reference input terminal 36A of comparator 28A is coupled to a power supply side of shunt 34A. Current shunt 34A is connected between a circuit power supply 38 and a lamp or lamps which act as the load on the circuit as indicated generally by block 40A. Power supply 38 typically comprises the battery and charge generating system of an automobile. A test input terminal 32B and a reference input terminal 36B of comparator 28B are similarly connected to a current shunt 34B. Current shunts 34A–34K may be portions of a printed circuit board trace or discrete shunt elements. As will be explained in greater detail, the selectable temperature sensitivity of the present invention allows integrated circuit 10 to use a variety of different types of current shunts. During operation, module 12 monitors the current through shunts 34A and 34B. If a failure in either a fuse supplying the monitored circuits or the lamps themselves occurs, module 12 will generate a fault signal.

Modules 14, 18, and 22 contain comparator circuits connected to respective current monitoring shunts in the same manner as described with respect to module 12. Modules 14, 18, and 22 contain single comparators 28C, 28H, and 28K which monitor the current through a single lamp in a lamp circuit.

Module 16 contains four comparators 28D–28G connected to respective current shunts 34D–34G. Module 16 detects lamp failures and fuse failures in individual lamps connected as parallel loads in a circuit controlled by a single switch. In module 16, comparators 28D and 28E share a single reference input terminal 36E. Comparator 28D compares the voltage at test input terminal 32D with the voltage at reference input terminal 36E. In the same manner, comparator 28E compares the voltage at test input terminal 32E with the voltage at reference input terminal 36E. Thus, comparators 28D and 28E share a single reference input terminal 36E. Comparators 28F and 28G are connected and operate in a similar manner as comparators 28D and 28E. Additionally, comparators 28D, 28E, and 28F, 28G are functionally interconnected by an exclusive-OR module 42 which provides an implicit fuse test function in a manner similar to exclusive-OR module 30.

Module 20 contains two comparators 28I and 28J, which also share a single reference input terminal 36J and which are connected and operate in a manner similar to comparator pairs 28D, 28E and 28F, 28G. As with module 16, module 20 detects lamp failures and fuse failures in individual lamps of the same circuit. Module 20 also contains an explicit fuse test circuit 44. A fuse test terminal 46 is connected between a power switch 50 and a fuse 48. As will be explained in greater detail, fuse test circuit 44 detects a failure of fuse 48 when switch 50 has been closed.

Bias module 26 supplies bias current and voltage for control of comparators 28A–28K. Bias module 26 contains circuitry for providing a selectable sensitivity of the comparator threshold switching voltage to changes in the voltage of power supply 38 as well as for providing a selectable sensitivity of the comparator threshold switching voltage to changes in the resistance of current shunts 34A–34K due to changes in temperature of the shunts as sensed by changes in temperature of integrated circuit 10. Bias module 26 is connected to power supply 38 at terminal 52. Bias module 26 provides regulated voltages and currents at terminals 54, 58, 60, and 62 which are coupled to respective terminals 54-1 through 54-7, 58-1 through 58-6, 60-1 through 60-6, and 62-1 through 62-7 of modules 12, 14, 16, 18, 20, 22, and 24 via respective connections 64, 66, 68, 70.

Timer module 24 is connected to power supply 38 at terminal 52. Module 24 receives output signals from modules 12, 14, 16, and 18 at terminal 65 from respective terminals 65-1 through 65-4 over connection 67. Module 24 also receives output signals from modules 20 and 22 at terminal 72 from output terminals 72-5 and 72-6 over connection 74. Terminals 76 and 78 provide expansion inputs for integrated circuit 10 that allow additional comparator circuits (not shown) to drive timer module 24 and thus expand the number of circuits that can be monitored. Terminal 80 is used to disable an error latching function of module 24. Terminals 82 and 84 provide for a connection to an external timer circuit such as RC circuit 90 including resistor 86 and capacitor 88 chosen by the integrated circuit user. The time constant of RC timer circuit 90 determines the length of time a fault detected by one or more of modules 12 through 22 must persist before an error signal is generated by integrated circuit 10. RC circuit 90 prevents current and voltage transients and noise disturbances from causing integrated circuit 10 to indicate a fault. Terminal 92 provides an output terminal to which a fault indicator, such as an incandescent lamp in the dashboard of an automobile may be connected to alert the driver to a lamp fault. As will be explained in detail, integrated circuit 10, and in particular timer module 24, is capable of supplying enough current to directly power an incandescent lamp connected to terminal 92.

A ground terminal 94 is coupled, via connection 96 to respective ground terminals 94-1 through 94-8 of modules 12, 14, 16, 18, 20, 22, 24, and 26 respectively. Terminal 94 is coupled to a ground or common terminal of power supply 38.

As noted previously, the threshold switching voltage of the comparators can be provided with a positive temperature coefficient, a negative temperature coefficient, or a temperature invariant sensitivity.

To ensure that integrated circuit 10 senses the temperature of the resistance shunts, for example, the integrated circuit is typically mounted in close proximity to the resistance shunts (whether they are discrete elements or portions of wiring), so that the integrated circuit and the resistance shunts are at approximately the same temperature. This may be accomplished in one of several ways. All of the shunts and integrated circuit 10 may be mounted on a single printed circuit board in close proximity to each other. Consequently, integrated circuit 10 and the shunts will all be at approximately the same temperature. Alternatively, integrated circuit 10 may be mounted in close proximity to a single shunt to sense the temperature change of the single shunt, with the remaining monitored circuits simply following the temperature change of the single shunt.

Figure 2:
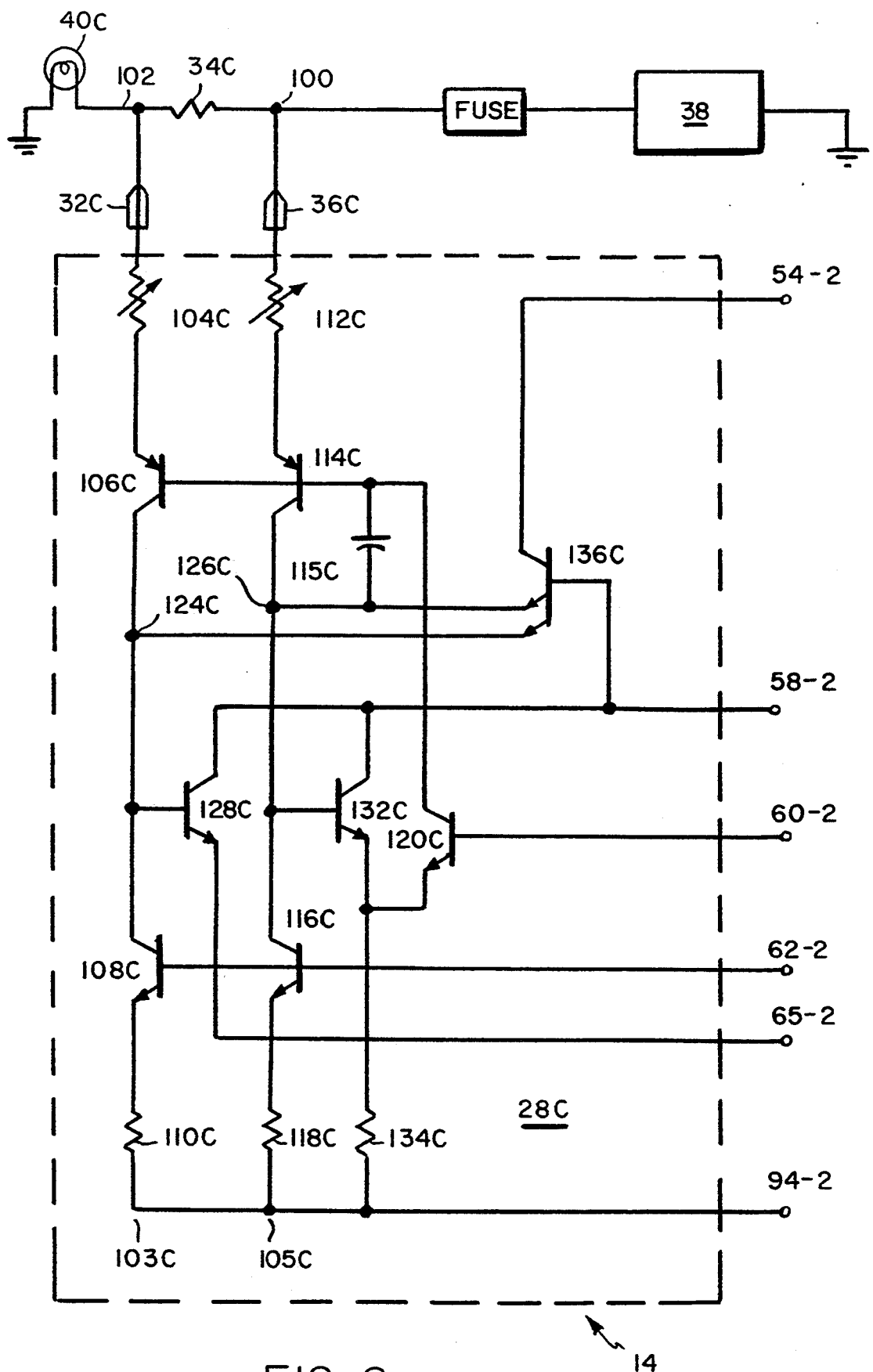
FIG. 2 is an illustrative schematic diagram of a basic comparator circuit used in the apparatus of FIG. 1.

Reference is now made to FIG. 2, which illustrates the basic comparator circuit used in comparators 28A–28K. For purposes of explanation, the comparator illustrated in FIG. 2 is comparator 28C which is used in module 14. Comparators 28A through 28B and 28D through 28K use the same basic circuit design as comparator 28C.

Current shunt 34C is coupled between power supply 38 and a lamp 40C. Comparator 28C monitors the current delivered by power supply 38 through shunt 34C to lamp 40C. Reference input terminal 36C, which is the inverting input of comparator 28C is coupled to the power supply side 100 of current shunt 34C. Test input 32C, which is the non-inverting input of comparator 28C, is coupled to the load side 102 of current shunt 34C. If lamp 40C is on and functioning properly, there is a voltage drop across shunt 34C. The threshold switching voltage of comparator 28C is set to be a voltage which is less than the voltage drop across the current shunt 34C when lamp 40C is on and functioning properly. In a typical automobile installation, the voltage drop across shunt 34C is a few millivolts. In one embodiment of the invention, the threshold switching voltage is approximately 3 mv. When the voltage drop across current shunt 34C is greater than 3 mv (as in the case when lamp 40C is properly functioning and drawing current) comparator 34C does not generate a fault signal. On the other hand, if the voltage drop across current shunt 34C is less than or equal to 3 mv, when node 100 has been switched on (as in the case where the lamp circuit as been switched on but lamp 40C is burned out), comparator 28C generates a fault signal indicating that lamp 40C is either not functioning or not present in the lamp circuit.

Comparator 28C is constructed in two legs including resistor 104C, transistor 106C, transistor 108C, and resistor 110C connected to terminal 32C comprising the first leg 103C and resistor 112C, transistor 114C, transistor 116C, and resistor 118C comprising the second leg 105C. Resistors 110C and 118C are connected to power supply ground or common at terminal 94-2. Bias voltage from bias module 26 is supplied to comparator 28C at terminal 62-2. This bias voltage biases transistors 108C and 116C so that the current through transistors 108C and 116C is approximately 10 microamps. Although the operation of comparator 28C is explained with reference to particular voltages and currents, one skilled in the art will appreciate that the present invention is not so limited, and other threshold switching voltages and bias levels may be set to enable the circuit to operate under other conditions, depending upon the particular application.

In one application of the present invention, the threshold switching voltage is set at 3 mv. That is, if the voltage drop across shunt 34C is greater than 3 mv, the circuit is operating properly. However, if the voltage at load side 102 of shunt 34C rises to within 3 mv of the voltage on the power supply side 100 of shunt 34C, a fault is indicated and comparator 28C will issue a fault signal. To set this threshold, when the currents through transistors 108C and 116C have been set at 10 microamps, the resistance of resistor 104C is designed to be or trimmed to be 300 Ohms less than the resistance of resistor 112C. Thus, when the voltage between terminals 32C and 36C is at the threshold switching voltage, the current through the two legs of the comparator is equal at approximately 10 microamps. A second bias voltage from bias module 26 is delivered to terminal 60-2 of comparator 28C. This bias voltage controls transistor 120C which biases transistors 114C and 106C to also operate with collector currents of 10 microamps when the voltage difference between terminals 32C and 36C is equal to the threshold switching voltage. When the voltage at terminal 32C is sufficiently low (as in the case where lamp 40C is operating properly), the current through transistor 106C is less than 10 microamps. Since transistor 108C is biased to sink 10 microamps, the voltage at node 124C is lower than the voltage at node 126C thus preventing transistor 128C from being switched on. On the other hand, if the voltage at terminal 32C rises (as in the case where lamp 40C is burned out) then the collector current of transistor 106C becomes equal to or greater than 10 microamps. Since transistor 108C only sinks 10 microamps, the voltage at node 124C rises until the voltage at node 124C is equal to or greater than the voltage at node 126C. Transistor 128C is turned on which sends a fault indication signal to timer module 24 via terminal 65-2.

Figure 6:
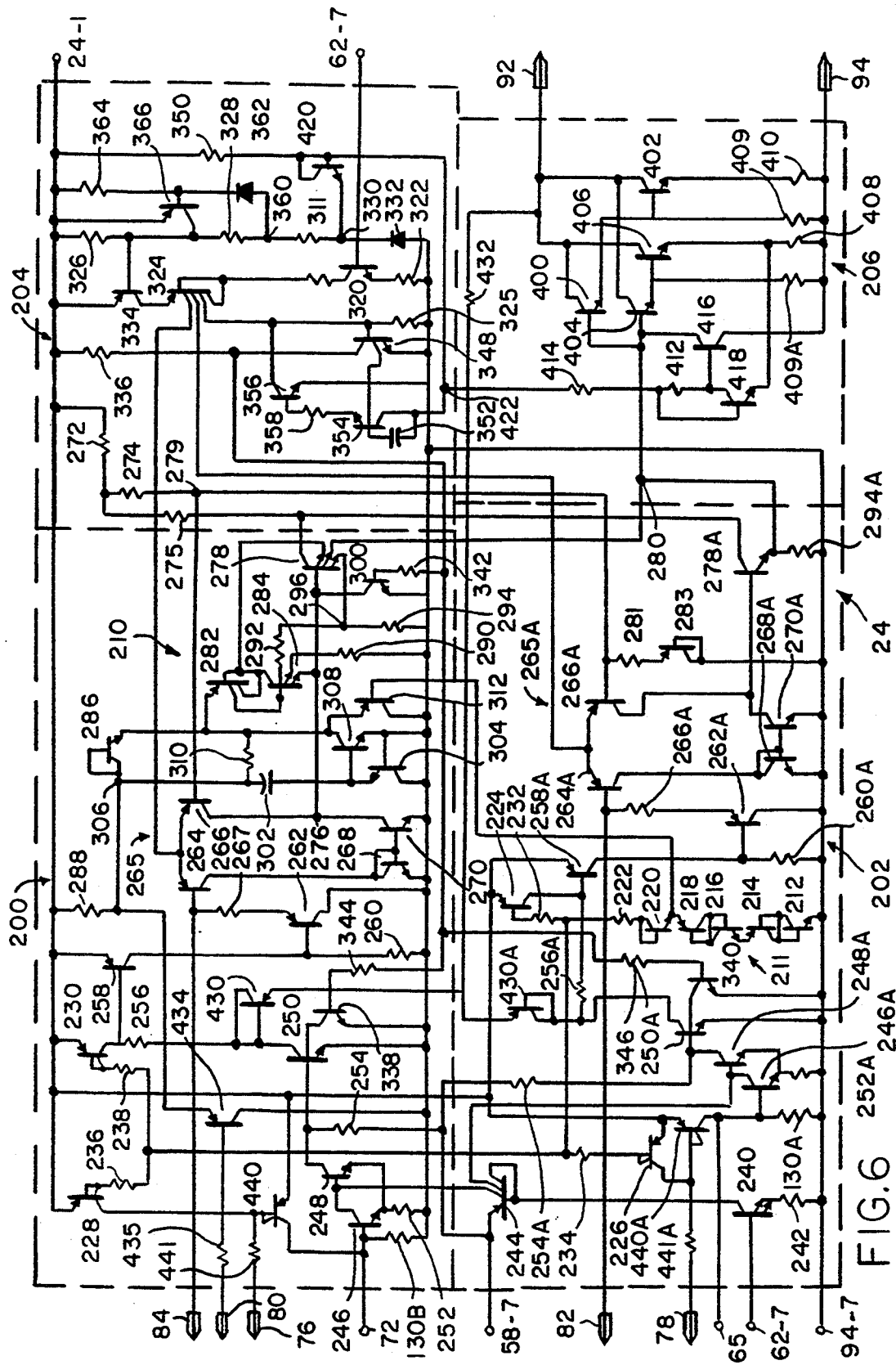
FIG. 6 is an illustrative schematic diagram of a timer, latch, and output driver circuit used in the apparatus of FIG. 1.

The comparator design has relatively low gain; therefore, the load circuits connected to the respective collectors of transistors 106C and 114C have to be well matched to ensure accurate switching. This is accomplished by making the load on transistor 114C similar to the load on transistor 106C. As will be explained in greater detail in conjunction with the operation of timer module 24, transistor 128C is connected to a resistor 130A (FIG. 6). To duplicate this load, transistor 132C is connected to and controlled by the voltage at node 126C. A resistor 134C having the same value as resistor 130A is connected to the emitter of transistor 132C. Thus, the load circuit connected to the collector of transistor 114C is the same as the load circuit connected to the collector of transistor 106C. As transistor 132C turns on, it raises the voltage at the emitter of transistor 120C which causes a reduction in the current drawn from the bases of transistors 106C and 114C. As a result, at the point where a fault indication is generated at terminal 65-2, the voltages at nodes 124C and 126C are approximately equal, the loads provided by transistors 128C and 132C at these nodes are nearly equal, and so the collector currents of transistors 106C and 114C are very nearly equal. Capacitor 115C is a frequency stability capacitor that ensures stability of the control loop formed by transistors 114C, 120C, and 132C.

In normal operation, the current in transistor 108C is greater than the current in transistor 106C, which causes node 124C to be low. When lamp 40C is off, both terminals 32C and 36C are low, which allows nodes 124C and 126C to go low. To prevent transistors 108C and 116C from saturating under these conditions and disturbing the bias line at terminal 62-2, transistor 136C is used to prevent the voltage of nodes 124C and 126C from decreasing below approximately one base-emitter voltage ($V_{BE}$). Since the bias voltage at terminal 58-2 is approximately 2 $V_{BE}$'s positive with respect to ground terminal 94-2 (as will be explained in greater detail below) when transistor 136C is on, nodes 124C (of leg 103C) and 126C (of leg 105C) are set at approximately one VBE.

Resistors 104C and 112C are somewhat large in value for two reasons. First, they can be trimmed to provide different threshold switching voltages. Second, resistors 104C and 112C help to reduce sensitivity to electromagnetic interference (EMI) because they isolate the P-N junctions of input transistors 106C and 114C from terminals 32C and 36C. The values of resistors 104C and 112C are a compromise between the desire for large resistances to reduce sensitivity to EMI and smaller resistances to preserve gain and set the fault detection threshold. The design of comparator 28C is particularly resistant to common mode EMI. Typically, EMI disturbs integrated circuits having junction transistors because the inputs to the integrated circuit cannot track high amplitude high frequency signals. The transistor junctions rectify these signals and the resulting current increases the voltage at the input terminals. In the present invention, if EMI such as an RF signal increases the collector current through transistor 114C, transistors 132C and 120C will reduce the base currents to transistors 114C and 106C to maintain the preset 10 microamp current through transistors 106C and 114C. Simulations indicate that common mode signals up to 800 mv peak to peak at 100 Mhz can be applied to terminals 32C and 36C without triggering a false fault indication at terminal 65-2.

The comparator of the present invention, as exemplified in FIG. 2, can distinguish small threshold switching voltages accurately. Its design is deceptively simple and uses a minimum number of components which must operate at the voltage applied to the lamp. Since the lamp is subject to large transient voltages, minimization of the number of components connected to the shunt improves the reliability of the circuit. In the comparator illustrated in FIG. 2, only three active devices, transistors 106C, 114C, and the collector of transistor 120C operate at or near the lamp voltage. Furthermore, only two base-emitter junctions, namely those of transistors 106C and 114C operate at the lamp voltage. The reduced number of components which must operate at the lamp voltage reduces the capacitance presented to the lamp circuit by comparator 28C, thus providing faster response and reducing the sensitivity of the comparator inputs to EMI conducted from the automobile wiring.

Figure 3:
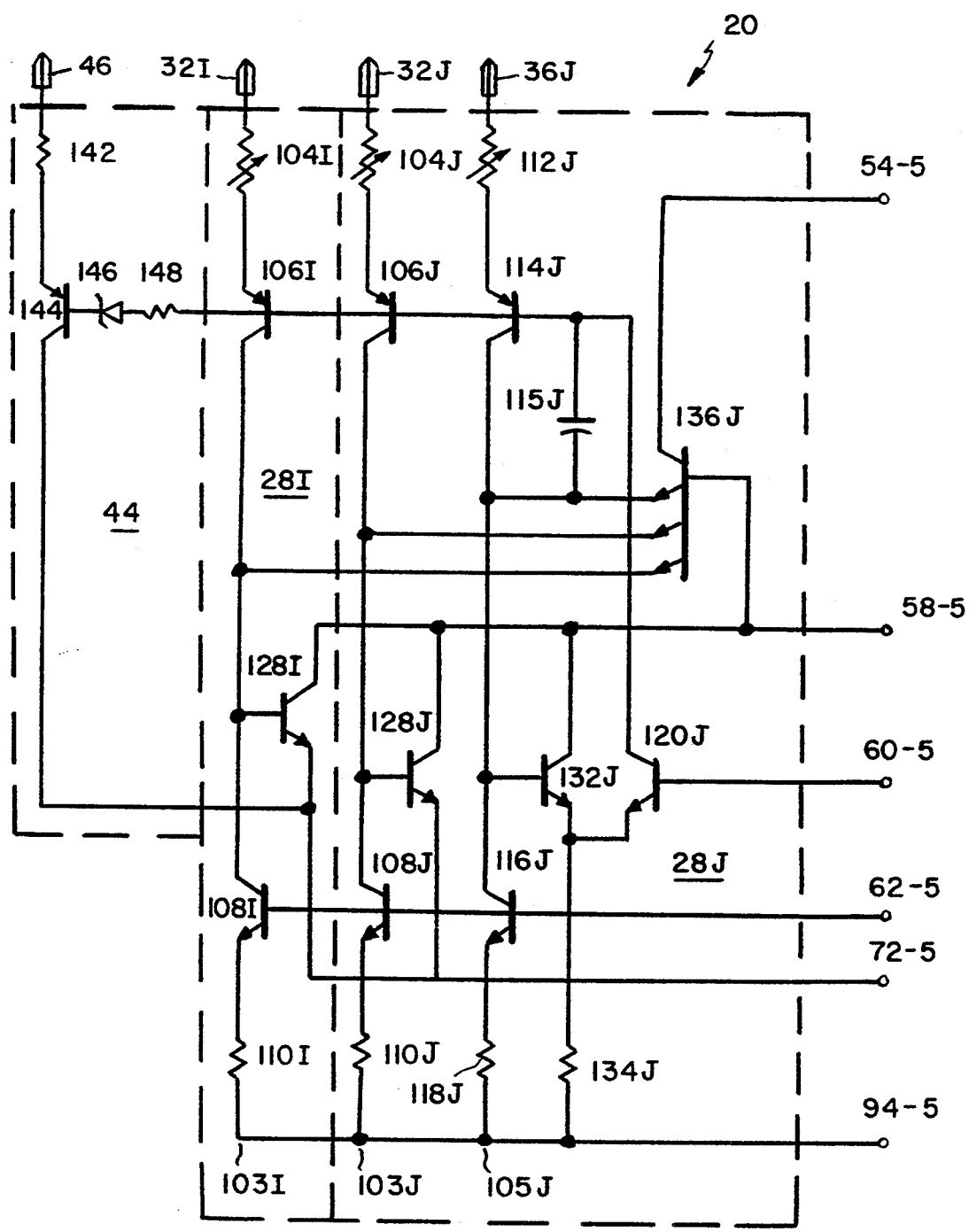
FIG. 3 is an illustrative schematic diagram of a variation of the basic comparator circuit illustrated in FIG. 2 illustrating multiple test inputs.

Reference is now made to FIG. 3, which illustrates a variation of the basic comparator circuit illustrated in FIG. 2. In particular, FIG. 3 is a schematic diagram of a circuit which may be used to carry out the function of module 20 illustrated in FIG. 1.

Comparators 28I and 28J (FIG. 1) are designed to monitor the condition of the brake lights in an automobile. Explicit fuse test circuit 44 is designed to monitor the condition of fuse 48 which supplies brake lamps 40I and 40J. Since the proper operation of brake lights in an automobile is important from a safety point of view, the circuit of FIG. 3 monitors both the brake lights and the fuse which supplies power to the brake lights.

Comparator circuits 28I and 28J operate in the same manner as comparator circuit 28C illustrated in FIG. 2. In the circuit of FIG. 3, however, comparators 28I and 28J share a common reference input terminal 36J. Comparator 28I compares the voltage at test input terminal 32I with the voltage at reference input terminal 36J to monitor the current through shunt 34I (shown only in FIG. 1). In a like manner, comparator 28J compares the voltage at test input terminal 32J with the voltage at reference input terminal 36J to monitor the current through shunt 34J. Until the design of the present invention, integrated circuit comparators having the ability to compare multiple test inputs with a single master reference input were made by paralleling multiple complete comparators. The addition of another test input to the comparator is accomplished by adding another leg 103I to the comparator. Leg 103I includes resistor 104I, transistor 106I, transistor 108I, and resistor 110I. Additionally, transistor 128I is added to respond to faults detected by leg 103I to drive output terminal 72-5 in the same manner as transistors 128J and 128C illustrated in FIG. 2. If the voltage at either terminal 32I or terminal 32J rises above the threshold switching voltage set by the respective relationship between resistors 114J/106J and 114J/106I.

The circuit illustrated in FIG. 3 also provides an explicit fuse test. The fuse test circuit includes resistor 142, transistor 144, zener diode 146 and resistor 148. When the lamp circuit monitored by comparators 28I and 28J is switched on, lamp voltage is applied to node 49 (FIG. 1). If the fuse is operating properly, terminal 46 is at approximately the same potential as shunts 34I and 34J (FIG. 1). If fuse 48 fails, however, only terminal 46 is at the applied voltage and terminal 36J is floating. Transistor 120J continues to bias transistor 114J to try to maintain a 10 microamp collector current in transistor 114J, but since no voltage is applied to terminal 36J, there is essentially no current flowing through transistor 114J. Transistor 120J is therefore in a maximum conduction state, which pulls the base of transistor 114J low. When the voltage difference between the base of transistor 144 (supplied through resistor 142 from terminal 146) and the base of transistor 114J exceeds the avalanche voltage of zener diode 146, transistor 144 turns on to directly provide a fault indication at terminal 72-5.

Transistor 136J is provided with an additional emitter to clamp leg 103I in the same manner as leg 103C of FIG. 2.

Figure 4:
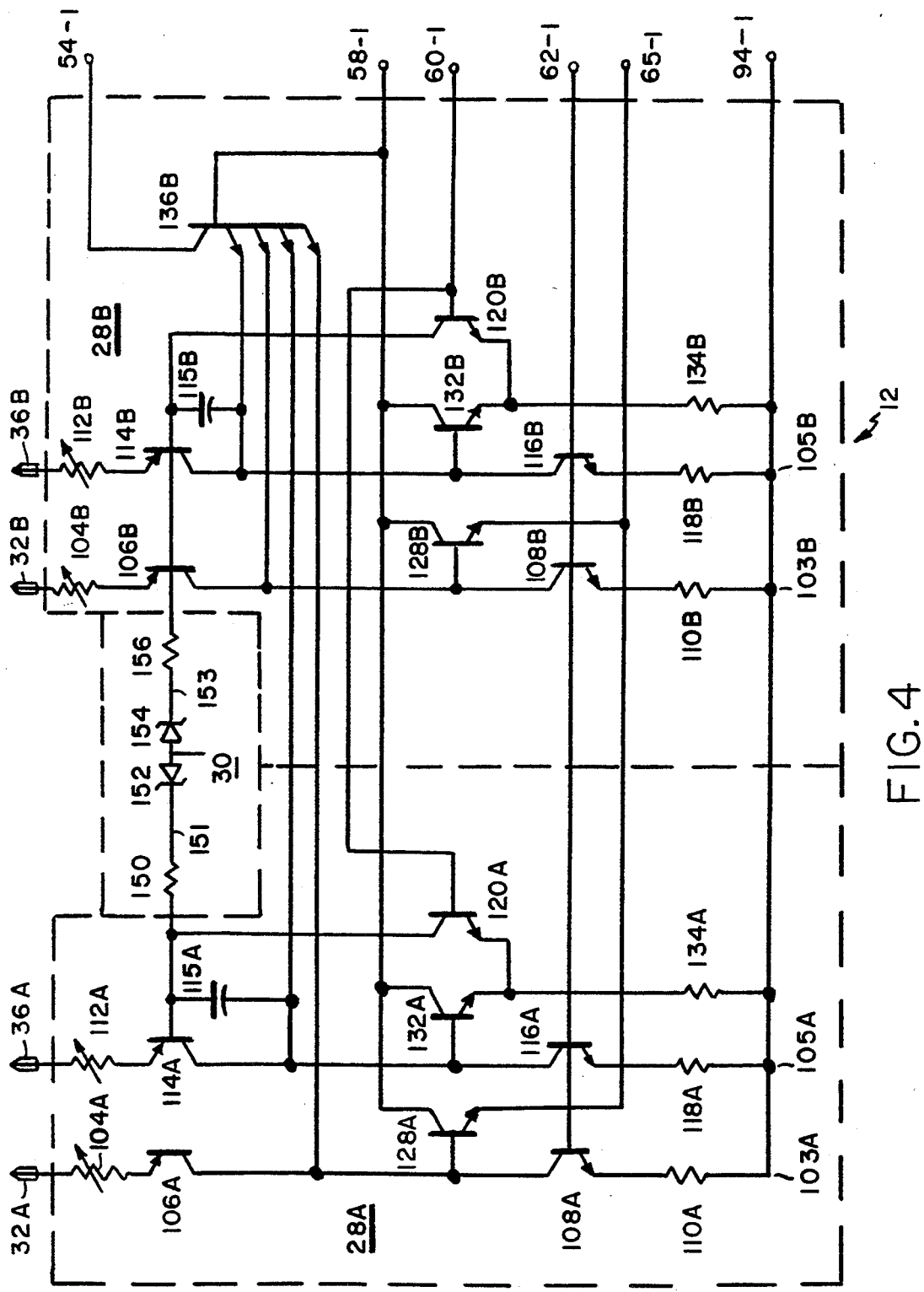
FIG. 4 is an illustrative schematic diagram of a pair of comparators illustrated in FIG. 1 linked by an exclusive-OR function to detect fuse failures in simultaneously switched lamp circuits.

Reference is now made to FIG. 4, which is a schematic diagram of a circuit that may be used to carry out the function of module 12 illustrated in FIG. 1. Comparators 28A and 28B operate in the same manner as comparator 28C. Module 12 is designed to test a pair of lamps which are switched on together but which receive power through independent fuses. Additional emitters are provided on transistor 136B to supply the previously described clamping function. Comparators 28A and 28B are electrically interconnected by exclusive-OR module 30 which schematically includes resistor 150, zener diodes 152 and 154 and resistor 156. If a fuse supplying power to either lamp circuit through shunt 34A and 34B fails, only one of the comparators 28A or 28B has lamp voltage applied to its respective test input terminal and reference input terminal. In this case, exclusive-OR module 30 causes the comparator which is on to be, in effect, overdriven and to indicate a fault even though the voltage at its test input terminal does not exceed the threshold switching voltage. For example, if the fuse supplying lamp power to the circuit monitored by comparator 28B failed, the base of transistor 114B goes low due to the action of the control loop including transistor 120B and 132B in the same manner as described in connection with the fuse test circuit of FIG. 3. When the voltage difference between nodes 151 and 153 exceeds the avalanche voltage of zener diode 152, current is conducted through resistor 150, diodes 152, 154, and resistor 156, changing the bias of transistor 106A. Transistor 106A is overdriven to turn on transistor 128A, providing a fault indication at terminal 65-1 even though the lamp circuit monitored by comparator 28A is operating properly. One skilled in the art will appreciate that the circuit of FIG. 4 provides an error indication if a fuse supplying lamp voltage to the circuits monitored by either comparator 28A or 28B fails.

Figure 5:
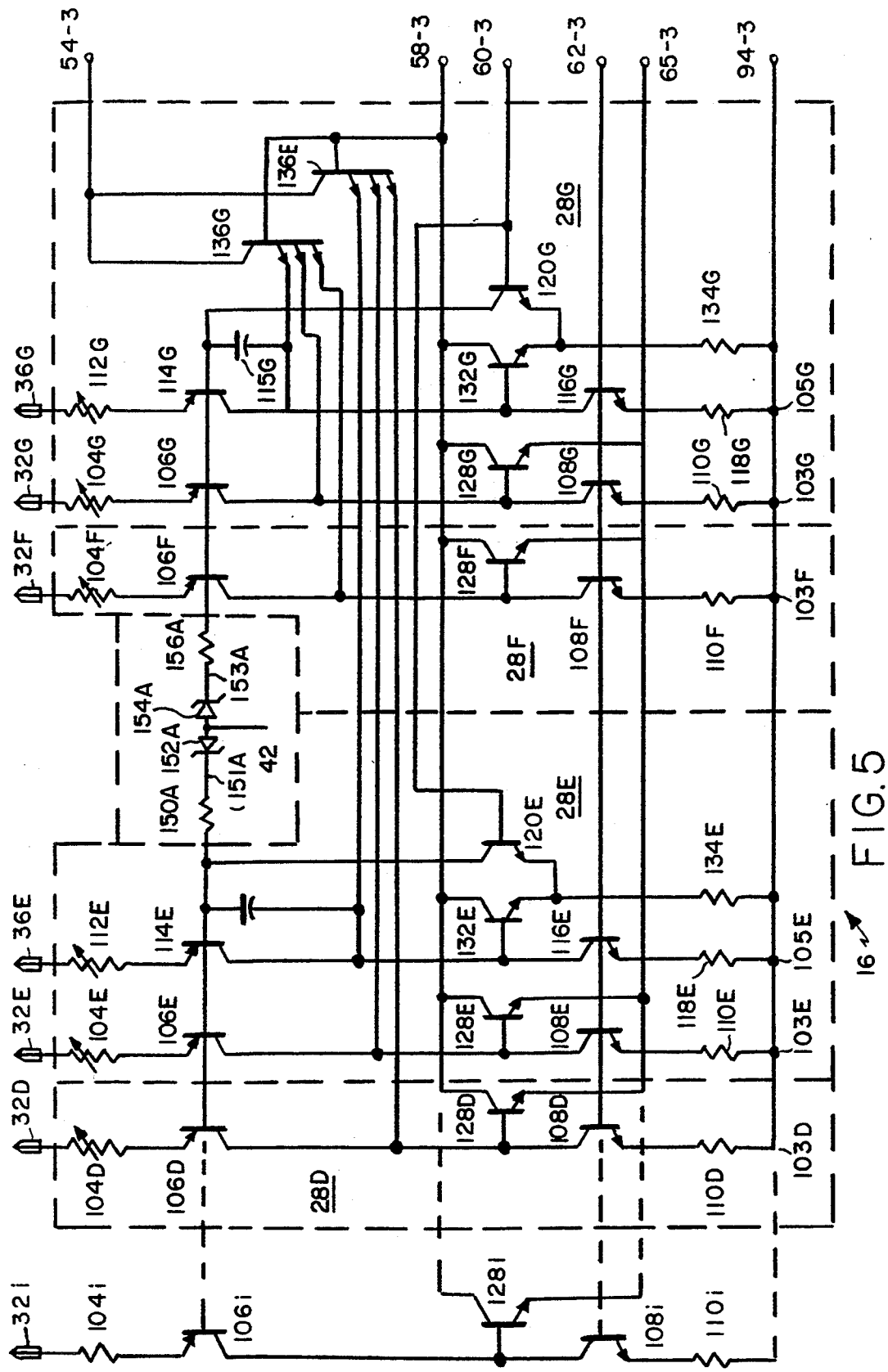
FIG. 5 is an illustrative schematic diagram of a variation of the circuit illustrated in FIG. 4, illustrating multiple test inputs.

Reference is now made to FIG. 5, which illustrates a schematic diagram of a circuit which may be used to carry out the function of module 16 illustrated in FIG. 1. In FIG. 5, four comparators are provided in two pairs, with each pair sharing a reference input terminal. The pairs of comparators are electrically interconnected by exclusive-OR module 42 which includes resistors 150A, 156A and diodes 152A and 154A. Comparators 28D, 28E and 28F, 28G operate in the same manner as comparators 28I, 28J illustrated in FIG. 3. In addition, exclusive-OR module 42 operates in the same manner as exclusive-OR module 30, illustrated in FIG. 4. Thus, the circuit of FIG. 5 combines the multiple test input comparators of FIG. 3 with the implicit fuse testing circuit illustrated in FIG. 4. The circuit of FIG. 5 operates in the same manner as described in connection with the circuits illustrated in FIGS. 3 and 4.

FIG. 5 also illustrates a significant feature of the comparators of the present invention. As noted previously in connection with the description of FIG. 3, comparators of the present invention may be provided with multiple test input terminals to compare the respective voltages at each of the test input terminals with the voltage at the reference input terminal. As shown in FIG. 5, further test input terminals for comparing the voltage at the test input terminal to the voltage at the reference input terminal may be added to the comparator of the present invention by simply adding additional legs $103i$ including resistor $104i$, transistor $106i$, transistor $108i$, resistor $110i$ and output transistor $128i$ to the basic comparator design.

Reference is now made to FIG. 6, which is a schematic diagram of a circuit which may be used to carry out the functions of timer module 24 illustrated in FIG. 1.

The circuit of timer module 24 illustrated in FIG. 6 has four separate portions. Portion 200 is a timer circuit with a latch for storing detected lamp faults. Portion 202 is a timer circuit which is the same as circuit 200 except it does not contain a latch circuit. Portion 204 is a power-on reset circuit and also includes circuits which disable the operation of the timer circuits when the power supply voltage is too high or too low. Portion 206 is a current limiting output driver circuit which, in one embodiment of the invention, can supply 200 milliamps of current to drive a fault indicator such as an incandescent lamp located in a dashboard of an automobile. The output driver circuit includes a current limiting function.

For purposes of illustration, the operation of timer circuit 200 will be explained in detail. However, one skilled in the art will appreciate that timer circuit 202 operates in the same manner, except it does not include the fault latching circuitry of timer circuit 200. Timer circuit 200 is designed to be used in conjunction with modules 20 and 22 as illustrated in FIG. 1. The fault signal of module 20 (or 22) at terminal 72-5 (or 72-6) is coupled to input terminal 72 of timer circuit 200. Since the brake lights of an automobile are generally only operated intermittently, if module 20 detects a failure of the brake lights, this failure will only persist for as long as the brake lights are being operated. Consequently, timer circuit 200 includes a latch circuit 210 which is designed to maintain a fault indication even after the brakes have been released by the driver.

As noted previously, an external resistor/capacitor timer circuit is connected between terminal 84 and the power supply ground. A fault condition which is detected by one of comparator modules 28I through 28K driving terminal 72 must persist for a time period longer than the time interval established by RC circuit 90. This feature allows an applications engineer to determine the length of time that a fault condition must persist (to avoid the effects of voltage transients and noise) before a fault indication is output by integrated circuit 10.

The bias voltage supplied by bias module 26 from terminal 62 that is used to control transistors 108 and 116 in comparators 28A through 28K to conduct 10 microamps of collector current is supplied at terminal 62-7 to control transistor 240 and resistor 242 to supply a 20 microamp current to transistor 244. This 20 microamp current is mirrored by transistor 244 to the collector of transistor 246 and the base of transistor 248. When transistor 246 is off, the 20 microamp current saturates transistor 248 which keeps the voltage at the base of transistor 250 low enough to prevent transistor 250 from turning on. When a fault indication is received at terminal 72, transistor 246 is turned on and the 20 microamp current from transistor 244 passes through transistor 246 and resistor 252 to ground. Consequently, transistor 248 is turned off and current delivered through resistor 254 turns transistor 250 on. Transistor 250 draws current through resistor 256, thus increasing the base-emitter voltage of transistor 258, turning it on. This circuit provides some hysteresis when the comparator inputs 32, 36 are at the threshold switching voltage to assure reliable switching and to prevent noise on the power supply lines from disturbing the switching operation.

When transistor 258 is off, resistor 260 turns on transistor 262 which holds the base of transistor 264 (and terminal 84) low through resistor 266. When transistor 258 turns on, transistor 262 is turned off and the voltage at the base of transistor 264 rises according the time interval established by RC circuit 90. Transistors 264, 266, 268, and 270 form a differential amplifier. As the voltage at the base of transistor 264 becomes equal to the voltage at the base of transistor 266 (supplied through resistors 272 and 274, node 281), an output will be generated at node 276 which turns on transistor 278 to generate an output signal indicating a lamp fault at node 280. If the fault signal at terminal 72 is momentary and ends before the RC circuit connected to terminal 84 has timed out, transistor 258 will turn off, transistor 262 turns on and resets RC circuit 90. If the fault signal at terminal 72 persists for a time period greater than the time it takes RC circuit 90 to charge to the voltage at the base of transistor 266 (node 281), latching circuit 210 will be triggered so that even if the fault signal disappears from terminal 72, transistor 278 will remain on and continue to generate a fault signal.

The operation of latching circuit 210 will now be explained. Latch 210 should not be triggered by turn-on and spurious events occurring in the automobile electric system. In addition, once latch 210 has been set, it should remain set over a wide range of conditions. In an automobile electrical system, these requirements are particularly difficult to meet since transient voltage conditions tend to be more severe. In one application of the present invention, latch 210 must remain set even when the power to integrated circuit 10 drops as low as 2.8 volts. Additionally, the latch should be able to withstand brief transients in which the voltage to the circuit actually goes to 0 for a brief time. However, the latch should reset if the power is turned off for some specified period of time.

Latch 210 is essentially an off/off type latch including a controlled beta transistor 282 having a beta of 1 and a transistor 284. When transistor 278 is turned on, one of its emitters, acting as an inverted collector, supplies current to the base of transistor 282. This current turns on transistor 282 which then draws current through diode 286 and resistor 288. Transistor 282 supplies current to the base of transistor 284 and the latch is turned on. To reduce the voltage necessary to turn on transistor 284, an emitter of transistor 284 is coupled to ground through resistor 290.

As will be explained in greater detail, power-on reset circuitry 204 turns on transistor 300 when the power supply voltage drops below approximately 7 to 8 volts in one embodiment of the invention to prevent false output indications. If latch 210 had been previously set, grounding of the base of transistor 278 does not reset the latch, since the latch current is supplied by resistor 288 through diode 286 into the emitter of transistor 282. Furthermore, in the case where the power supply voltage is very low, resistor 310 bypasses diode-connected transistor 286 to supply the current needed to keep latch 210 on.

Consequently, in one embodiment of the invention, the power supply voltage can decrease to and remain at approximately 2.8 volts indefinitely and latch 210 still remains set.

To reduce the current required to keep latch 210 on (especially under conditions of low power supply voltage), one emitter of transistor 278 is connected between resistors 292 and 294 which are connected between the base of transistor 284 and ground. This reduces the current required to keep transistor 284 turned on by increasing the voltage at node 296.

The combination of controlled beta transistor 282 and resistors 292 and 294 also prevents displacement currents which flow during power-on due to parasitic capacitances between components and the substrate from generating currents large enough to turn on latch 210. Resistors 292 and 294 are chosen to be small enough in value so that parasitic currents flowing through them do not turn on latch 210 and at the same time large enough in value to help keep latch 210 on when it is turned on during normal operation.

To additionally prevent displacement currents from parasitic capacitances from setting latch 210, a capacitor 302 and a diode-connected transistor 304 are connected between node 306 and ground. The slow charging effect of capacitor 302 is multiplied by transistor 308 thus making capacitor 302 appear electrically larger and providing a longer time constant for charging of the parasitic capacitances. Transistor 312, using a voltage derived from diode network 211 limits the voltage at the collector of transistor 308 to a value that allows latch 210 to turn on, but that prevents transient voltages from activating the latch. If a transient were to occur during the time which capacitor 302 was charging, in the absence of diode 304, capacitor 302 would remain at its pre-transient voltage after the transient is over which might immediately cause latch 210 to be turned on. However, if the voltage at node 306 was to drop quickly, diode 304 becomes forward biased and capacitor 302 is discharged. (If the power supply voltage decreases to 0 for a short period of time, capacitor 302 can supply a finite amount of current to keep latch 210 on.) When the voltage at node 306 again increases, diode 286 reduces the voltage excursion experienced by node 306 to prevent latch 210 from being turned on.

Latch circuit 210 thus meets all of the requirements outlined above and is particularly well suited to use in automotive applications where low voltages and negative and positive voltage transients are common. Latch 210 is essentially immune to power supply transients.

The operation of power-on reset circuitry 204 will now be explained. At some predetermined power supply voltage (typically 7-8 volts) applied to terminal 52, the voltage across resistors 326, 311, and 328 exceeds the avalanche voltage of zener diode 332. When zener diode 332 avalanches, current flows through resistor 326 which increases the drive to the base of transistor 334 which turns on transistor 324. When the appropriate bias current is supplied to terminal 62-7, transistor 320 and resistor 322 operate in the same manner as transistor 116 and resistor 118 in each of the comparators 28 to produce a 10 microamp collector current. Current mirror transistor 324 replicates this 10 microamp current and supplies it to various portions of timer circuit 24.

When the power supply voltage is low, but not 0, current flows through resistor 336 to transistor 300, transistor 338, and transistor 340 through respective resistors 342, 344, and 346 which provide for current sharing among the three transistors. Transistors 300, 338, and 340 ground certain parts of the timer circuitry and latch circuitry to prevent operation before the power supply voltage has reached an appropriate level. As the power supply voltage continues to rise, transistor 348 is turned on by the action of transistor 324 which turns off transistors 300, 338, and 340, enabling circuit operation. Resistor 325 maintains the base of transistor 348 low to ensure that the current supplied by transistor 334 to transistor 324 is adequate for circuit operation.

To prevent parasitic displacement currents from disturbing circuit operation when the power supply is turned on very rapidly, resistor 350 charges capacitor 352 to turn on transistor 354. Transistor 354 turns on transistor 356 by supplying current through resistor 358 which reduces the voltage at the base of transistor 348 to maintain transistors 300, 338, and 340 on for a longer period of time even though more than the minimum voltage may be applied to terminal 24-1. Eventually, capacitor 352 is discharged through the base of transistor 354. Transistors 354 and 356 turn off and transistor 348 turns on. A second emitter of transistor 348 is connected to the base of transistor 354 and keeps transistor 354 off as long as transistor 348 is on. When the power supply is turned off, capacitor 352 is discharged through the second emitter of transistor 348.

If the power supply voltage becomes too high, the voltage between terminal 24-1 and node 330 and therefore at node 360 increases until zener diode 362 turns on. When diode 362 is on, current is supplied through resistor 364 to the base of transistor 366 as loaded by resistor 364. Transistor 366 turns on, which raises the voltage at the base of transistor 334, turning it off. As a result, transistor 324 shuts off and the circuit reverts to a low power supply condition in which transistors 300, 338, and 340 are turned on to disable circuit operation.

The operation of output driver circuit 206 will now be explained. When node 280 is turned on by transistors 278 or 278A, transistors 400, 402 which form a first Darlington output circuit and transistors 404 and 406 which form a second Darlington output circuit are turned on to supply a sufficient current (in one embodiment of the invention approximately 200 milliamps) to output terminal 92 in order to drive a fault indicator. The use of two Darlington output circuits allows larger resistance ballast resistors to be used to better control the Darlington circuit operation, so that the two Darlington output circuits can deliver a greater total current than a single Darlington output circuit. One skilled in the art will appreciate that a single Darlington circuit could have been used. Due to the relatively large currents involved, resistors 408 and 410 are made by a process which results in the low resistance required (on the order of 2 Ohms in one embodiment) without occupying a large surface area within the integrated circuit. An example of this type of process is an emitter diffusion process. However, the emitter diffusion process results in a resistor having a large temperature coefficient and a resistance value which is not particularly well-controlled. Therefore, a third resistor 412 made using the same emitter diffusion process is incorporated into the integrated circuit. The ratio of the resistance of resistor 412 and the resistance of resistor 408 (and the resistance of resistor 412 and the resistance of resistor 410) track each other with the current through resistor 412 determined by resistor 414. Resistor 414 is constructed using a thin film type process so that its resistance and consequently its current are controlled with much greater accuracy. When the voltage across resistor 408 rises to a predetermined level, a corresponding rise in voltage at the base of transistor 416 will also occur. Transistor 416 will begin to turn on and reduce the voltage at the base of transistors 400 and 404, thus controlling the output current. To compensate for the effects of temperature on transistor 416, diode-connected transistor 418 is included which offsets the base voltage of transistor 416 by the base-emitter voltage of transistor 418 minus the voltage across resistor 412. At high supply voltages, diode connected transistor 420 clamps node 422 to the voltage of zener diode 332 to limit the maximum current delivered through resistor 350 to resistor 414, and hence limit the output current.

A preview circuit is also provided in timer circuit 24 which allows testing of the integrated circuit without waiting until the external timer circuit connected to terminals 82 or 84 times out. Prior to the invention of the present apparatus, the inventor is unaware of this feature being provided in an integrated circuit. When either transistor 250 or 250A are turned on, diodes 430 and 430A provide current to terminal 92 through resistor 432. This current is not large enough to light a fault indicator lamp connected to terminal 92 in normal operation, but the current can be detected by suitable test equipment.

The signal from transistor 278 or 278A to node 280 is current limited by resistor 275. This current is injected into the network including resistor 272, 274, 279 and diode-connected transistor 283 to establish the threshold of differential amplifier 265 or 265A. This provides a slight positive feedback that results in a small hysteresis ensuring positive switching of the differential amplifier to ensure that transistors 400, 402, 404, and 406 of output driver circuit 206 are saturated.

In some cases, the operation of latch circuit 210 needs to be disabled. By connecting terminal 80 to the power supply ground, transistor 434 is turned on through resistor 435 which prevents current from being delivered to latch 210 thus disabling the latching function.

Diodes 212 through 220, resistor 222, and diode connected transistors 224, 226, 228, and 230 are used to set a threshold for the expansion inputs and timer circuits to provide maximum noise immunity. Resistors 232, 234, 236, and 238 are used to trim the current delivered to the respective transistors.

Expansion terminals 76 and 78 are provided which allow circuits (not shown) to be cascaded, thus effectively expanding the capacity of integrated circuit 10 to monitor additional circuits. For example, when terminal 76 is driven low by a signal from another circuit, transistor 440 is turned on through resistor 441 which controls terminal 72 in the same manner as previously described.

Figure 7:
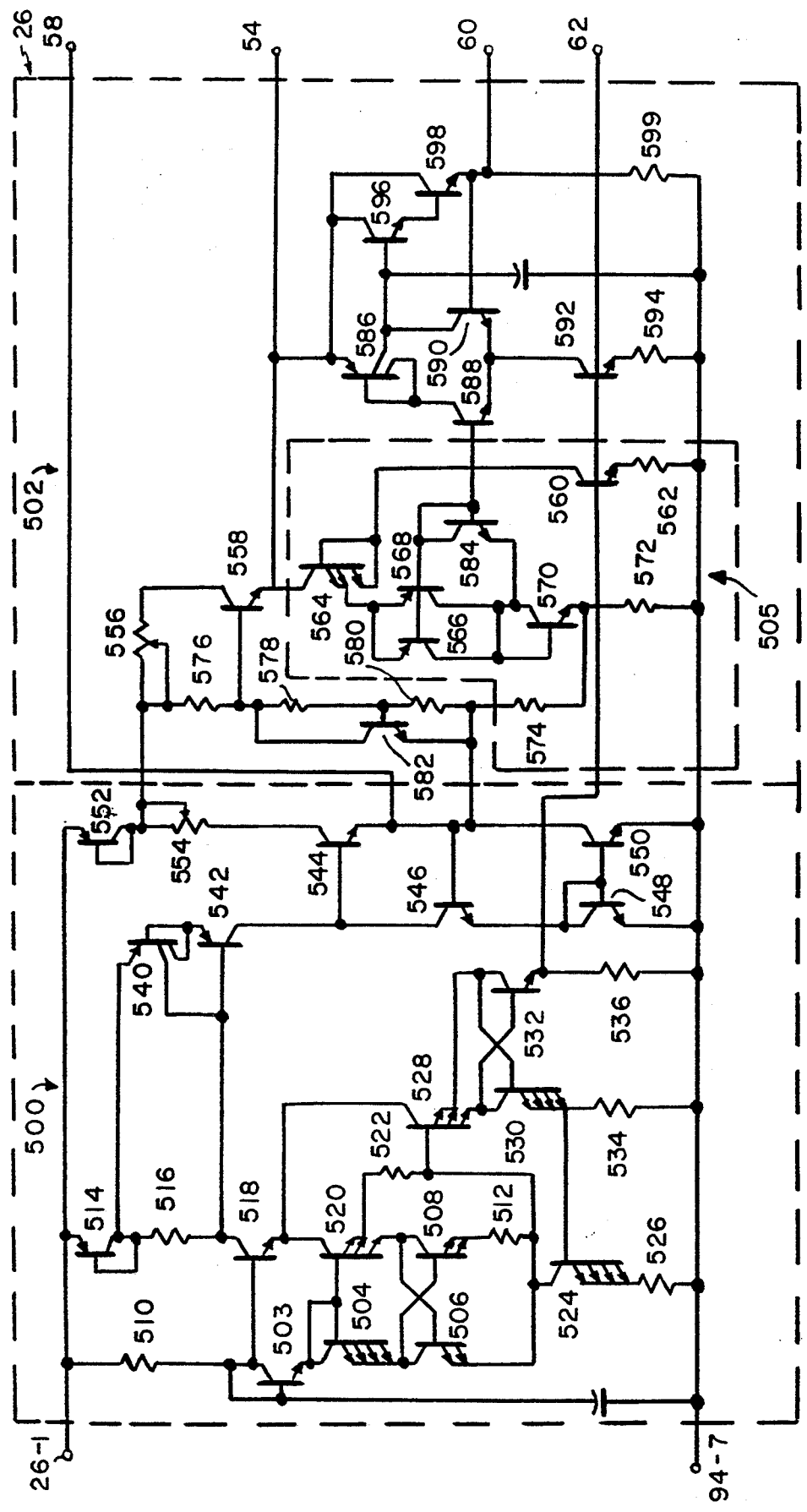
FIG. 7 is an illustrative schematic diagram of a bias circuit used in the apparatus of FIG. 1.

Reference is now made to FIG. 7, which is a schematic diagram of a circuit that may be used to carry out the functions of bias module 26 illustrated in FIG. 1. The bias circuit illustrated in FIG. 7 includes a sensitivity control circuit 500 and an output circuit 502. Sensitivity control circuit 500 provides selectable control of the sensitivity of the threshold switching voltage to changes in the supply voltage of the circuit and at the same time provides selectable control of the sensitivity of the threshold switching voltage to changes in temperature. Sensitivity control circuit 500 allows the threshold switching voltage of the comparators of integrated circuit 10 to have selectable sensitivity to temperature changes including a positive temperature coefficient, a negative temperature coefficient, or to be temperature invariant. Sensitivity control circuit 500 also allows the threshold switching voltage of the comparators of integrated circuit 10 to have a desired selectable sensitivity to changes in the supply voltage of the circuit. Output circuit 502 provides the necessary bias currents and voltages for operation of all of the modules in integrated circuit 10 under the control of sensitivity control circuit 500.

It is a well-known phenomenon that the current consumed by a load such as an incandescent lamp varies as the voltage applied to the lamp changes. In general, lamp current varies at approximately one half the rate of change of the supply voltage. For example, if the voltage applied to the lamp doubles, the lamp current becomes one and a half times larger. That is, if the applied voltage doubles, the lamp current increases by approximately 50%. Therefore, sensitivity control circuit 500 provides the capability to adjust the bias voltage supplied to comparators 28, if desired, so that the comparators correctly track this change in current as the supply voltage changes and do not cause false fault indications. The present invention can provide more than simply a fixed sensitivity to changes in supply voltage. Through appropriate selection of component values, the circuit of the present invention provides any desired controlled sensitivity of the threshold switching voltage to changes in the power supply voltage. The sensitivity to changes in power supply voltage is selectable.

It is also a well-known phenomenon that the resistance of various materials which are used to construct current shunts changes as the temperature of the shunt changes. Depending upon the particular material used, the current shunt may have a positive or negative temperature coefficient. A comparator circuit monitoring the current through a shunt must account for the change in resistance that occurs with temperature to avoid false fault indications. Through appropriate selection of component values, the circuit of the present invention provides the capability of controlled sensitivity (including being insensitive to temperature changes) of the threshold switching voltage to temperature-induced changes. The temperature sensitivity of the threshold switching voltage can be adjusted to track the temperature-induced changes in the resistance of the current shunt, if desired. Using sensitivity control circuit 500 and output circuit 502, bias module 26 controls the operating point of comparators 28A-28K to provide the desired sensitivity of the threshold switching voltage to temperature induced changes and to changes in the power supply voltage.

The operation of sensitivity control circuit 500 will now be explained. Transistors 504, 506, 508, and 520 are connected as a crossed-quad PTAT (Proportional to Absolute Temperature) generator. The voltage between the emitters of transistors 506 and 508 is proportional to absolute temperature. Consequently, the current through resistor 512 is proportional to absolute temperature. Resistor 522 coupled to one of the emitters of transistor 520, provides a current at the collector of transistor 524 which is CTAT (Complimentary to Absolute Temperature). The CTAT and PTAT currents are added together at the collector of transistor 524 to form the current conducted by transistor 524 and resistor 526. The voltage across resistor 522 is approximately the same as the base-emitter voltage of transistor 506 since the voltage across resistor 522 is derived from an extra emitter of transistor 520 which acts as the driver for transistor 506.

The value of resistor 510 is selected so that changes in the power supply voltage modulate the current in transistor 524 to change the current at terminal 62 with a sensitivity dependent upon the selected resistance value of resistor 510.

To select the values for resistors 510, 512, and 522, first resistor 510 is selected which sets the sensitivity of the threshold switching voltage to changes in the power supply voltage. The sensitivity of the threshold switching voltage to changes in the power supply voltage is determined entirely by the value of resistor 510. The current through resistor 512 provides a PTAT current which increases with temperature. The current through resistor 522 provides a CTAT current which decreases with temperature. The values of resistors 512 and 522 are selected so that when the currents are added together in the collector of transistor 524, the resulting current has the desired temperature characteristic. The current addition is simply a linear addition of currents. The values of resistors 512 and 522 are also selected to provide any necessary incidental temperature compensation of the current through resistor 510. Consequently, the collector current of transistor 524 contains a component that is sensitive to supply voltage changes (supplied by resistor 510) and a component that is sensitive to temperature changes (supplied by resistors 512 and 522). These currents are added together in the collector of transistor 524 so that the current through the bias generator has the desired sensitivity to temperature and supply voltage. Consequently, the bias current and voltage provided at terminal 62 will have a combined sensitivity to changes in the power supply voltage and to temperature changes as a function of the values of resistors 510, 512, and 522. The sensitivity of the circuit is adjusted by adjusting the values of resistors 510, 512, and 522.

Transistor 524 is controlled by the follower circuit including transistors 528, 530, 532, and resistors 534 and 536. Transistors 530 and 532 are connected in a crossed-quad fashion so that the voltage at the emitter of transistor 532 controls a base of a transistor connected to terminal 62 to bias that transistor to operate with a 10 microamp collector current.

Current from the power supply independent portion of the bias circuit PTAT generator is also supplied to transistors 540 and 542 so that the current through transistor 540 is constant. Resistor 516 removes the temperature component of current from transistor 518 by using the $V_{BE}$ of transistors 514 and 542 so that the current in transistor 540 is NPO. One-half the current from transistor 540 is transmitted via the collector of transistor 542 to the current mirror comprising transistors 544, 546, 548, and 550. The current mirror provides the necessary current source and current sink for loads connected to terminal 58. Terminal 58 is approximately two $V_{BE}$'s above the power supply ground.

Transistor 552 provides current, under the control of transistor 544 and current-limiting resistor 554 to supply voltage for control of the comparators connected to terminal 54 through current-limiting resistor 556 and transistor 558.

The operation of output circuit 502 will now be explained. Output circuit 502 is a replica bias circuit whose main function is to provide a bias voltage at terminal 60 that controls transistor 120 in each of the comparators 28 to control transistor 132 through transistor 114 so that transistor 132 mimics the operation of transistor 128 at the threshold switching voltage. Output circuit 502 controls the voltage at terminal 60 so that at the threshold switching voltage, the base voltage supplied to transistors 106 and 114 by transistor 120 is the base voltage required to have transistor 106 and transistor 114 operate at 10 microamps of collector current. Output circuit thus sets the switching threshold of comparators 28A-28K. This desired bias voltage is created as follows. Transistor 560 and resistor 562 are connected to bias terminal 62 and are set to that the collector of transistor 560 biases the base of a transistor to which it is connected to operate with 10 microamps of collector current. Transistor 560 and resistor 562 effectively duplicate the function of transistors 108, 116, and respective resistors 110, 118 in each of the comparators 28. The collector of transistor 560 controls the base of a current doubling transistor 564 which produces a 20 microamp current which is shared by transistors 566 and 568. Transistors 566 and 568 thus duplicate the current conducted by transistors 106 and 114 at the threshold switching voltage of the comparator. The collectors of transistors 566 and 568 supply the 20 microamp current to transistor 570 and resistor 572 which replicate the function of transistor 246 and resistor 252 in timer circuit 200, 202. Additionally, resistor 574 duplicates the bias current level of resistor 254 in timer circuit 200, 202. Resistors 576, 578, 580 and transistor 582 buffer the current supplied to resistor 574 to bias transistor 558 to provide a voltage at terminal 54 that is one $V_{BE}$ higher than the voltage at terminal 58. Transistor 584 duplicates the effect of transistor 120 when it is supplying the base current necessary to drive two PNP transistors at 10 microamps as it does in each of the comparators 28. Thus, transistors 584, 566, and 568 duplicate the operation of transistors 106, 114, and 120 in each comparator when the comparator is at the threshold switching voltage. Thus, output circuit 502 produces a voltage at the base of transistor 584 which is the voltage desired at the base of transistor 120 when that transistor is supplying the base current necessary to operate transistors 106 and 114 at 10 microamps each. The voltage at the base of transistor 584 is supplied to a unity gain amplifier including transistors 586, 588, 590, 592, and resistor 594 and a Darlington follower circuit including transistors 596 and 598. Consequently, the voltage at the base of transistor 584 is buffered and supplied via terminal 60 to all of the comparators 28 in integrated circuit 10 to set the threshold of the comparators.

To reiterate, replica bias circuit 505 duplicates the condition where one of the comparators 28 is driving the input to timer circuit 200 or 202 when the voltage at the input terminals of the comparator is at the threshold switching voltage in order to set the bias point of the comparators at the threshold switching voltage.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. An apparatus for monitoring current flowing through a shunt in a circuit, comprising:

a comparator having two output states and being responsive to a voltage developed across a shunt in the circuit as a result of the current flowing through the circuit, the shunt being coupled to the comparator, so that the comparator assumes one of its two output states when the voltage developed across the shunt is greater than a predetermined threshold switching voltage of the comparator and the other of its two output states when the voltage developed across the shunt is less than said threshold switching voltage, said threshold switching voltage changing as a result of changes in a supply voltage of the circuit or changes in temperature; and a threshold switching voltage sensitivity control circuit coupled to and controlling the threshold switching voltage of the comparator for providing selectable control of sensitivity of the threshold switching voltage to changes in a supply voltage of the circuit and for providing selectable control of a sensitivity of the threshold switching voltage to changes in temperature.

2. The apparatus of claim 1, wherein the threshold switching voltage sensitivity control circuit includes means for controlling the sensitivity of the threshold switching voltage so that the threshold switching voltage changes to track changes in a resistance of the shunt due to changes in temperature.

3. The apparatus of claim 1, wherein the threshold switching voltage sensitivity control circuit controls the sensitivity of the threshold switching voltage so that the threshold switching voltage changes to track changes in a temperature of the apparatus.

4. The apparatus of claim 1, wherein the comparator comprises:
- a reference voltage input circuit which establishes a reference voltage;
- a first test voltage input circuit which senses a voltage on a load side of the shunt;
- at least one additional test voltage input circuit which senses a voltage on a load side of an additional shunt disposed in another circuit; and
- comparison means for comparing the voltage sensed by the first test voltage input circuit to the reference voltage and for comparing the voltage sensed by the at least one additional test voltage input circuit to the reference voltage.

5. The apparatus of claim 1, further comprising:
- a current limiting output driver circuit, coupled to the comparator and responsive to the output states of the comparator, for supplying an output current representative of a fault in the circuit to a fault indicator.

6. The apparatus of claim 5, further comprising:
- a timer circuit, coupled between the comparator and the output driver circuit, for delaying activation of the output driver circuit for a selectable, predetermined time interval in response to one of the output states of the comparator.

7. The apparatus of claim 6, further comprising a latching circuit, coupled to the timer circuit for storing the output state of the comparator upon activation of the output driver circuit.

8. The apparatus of claim 6, further comprising:
- a preview circuit coupled to the comparator for bypassing the timer circuit and the output driver circuit to supply a signal representative of a fault in the circuit.

9. The apparatus of claim 1, wherein the shunt includes a first terminal coupled to the circuit supply voltage and a second terminal coupled to a load and the comparator further comprises:
- first and second input terminals respectively coupled to the first and second terminals of the shunt;
- a first single active device connecting the first input terminal to the comparator;
- a second single active device connecting the second input terminal to the comparator; and
- a third single active device for controlling the first and second active devices.

10. The apparatus of claim 8, wherein the apparatus is fabricated as an integrated circuit.

11. The apparatus of claim 10, wherein the apparatus is fabricated as a monolithic integrated circuit.

12. The apparatus of claim 9, wherein the apparatus is fabricated as an integrated circuit.

13. The apparatus of claim 12, wherein the apparatus is fabricated as a monolithic integrated circuit.

14. The apparatus of claim 1, wherein the shunt includes a first terminal coupled to the circuit supply voltage and a second terminal coupled to a load and the comparator further comprises:
- first and second input terminals respectively coupled to the first and second terminals of the shunt;
- a first single device including a base-emitter junction connecting the first input terminal to the comparator; and
- a second single device including a base-emitter junction connecting the second input terminal to the comparator.

15. An integrated circuit for monitoring current flowing through a circuit, comprising:
- comparator means, having at least a test input coupled to one node in the circuit, a reference input coupled to another node in the circuit, and an output, for comparing a voltage at the test input with a voltage at the reference input to control the output in response to a difference between the voltage at the test input and the voltage at the reference input, the difference between the voltage at the test input and the voltage at the reference input changing as a result of changes in a supply voltage of the circuit or changes in temperature; and
- a sensitivity control means, coupled to and controlling the comparator means, for providing selectable control of (1) a sensitivity of the difference between the voltage at the test input and the voltage at the reference input of the comparator means to changes in a supply voltage of the circuit and (2) a sensitivity of the difference between the voltage at the test input and the voltage at the reference input of the comparator means to changes in temperature.

16. The apparatus of claim 1, wherein the shunt in the circuit is coupled between a power supply and a load.

17. The apparatus of claim 16, wherein the load includes at least one lamp in an automobile.

* * * * *